(12) United States Patent
Heiman et al.

(10) Patent No.: US 10,770,586 B2
(45) Date of Patent: Sep. 8, 2020

(54) STRESSING STRUCTURE WITH LOW HYDROGEN CONTENT LAYER OVER NISI SALICIDE

(71) Applicant: Tower Semiconductor Ltd., Migdal Haemek (IL)

(72) Inventors: Alexey Heiman, Ramat Yishai (IL); Igor Aisenberg, Afula (IL); Abed Qaddah, Majd Al Kuroom (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 15/888,071

(22) Filed: Feb. 4, 2018

(65) Prior Publication Data

US 2019/0245086 A1  Aug. 8, 2019

(51) Int. Cl.
*H01L 29/78* (2006.01)
*H01L 29/45* (2006.01)
(Continued)

(52) U.S. Cl.
CPC ........ *H01L 29/7843* (2013.01); *H01L 21/022* (2013.01); *H01L 21/0217* (2013.01);
(Continued)

(58) Field of Classification Search
None
See application file for complete search history.

(56) References Cited

U.S. PATENT DOCUMENTS 6,071,784 A    6/2000  Mehta et al.
6,153,512 A  * 11/2000  Chang ............... H01L 21/02131
                                                257/E21.242
(Continued)

FOREIGN PATENT DOCUMENTS

JP          200031092       10/2000

OTHER PUBLICATIONS

Tsuchiaki et al. "Junction Leakage Generation by NiSi Thermal Instability Characterized Using Damage-Free n+/p Silicon Diodes", jpn. J. Appl. Phys. 43 5166, 2004 (Toshiba).
(Continued)

*Primary Examiner* — Nilufa Rahim
(74) *Attorney, Agent, or Firm* — Bever, Hoffman & Harms, LLP

(57) ABSTRACT

A multi-layer SiN stressing stack (structure) including a thin lower SiN layer and a thick upper SiN layer is formed over NiSi silicide structures and functions to generate tensile channel stress in NMOS transistors. The lower SiN layer is formed directly on the silicided surfaces, and has a low hydrogen content and a relatively low residual stress. The upper SiN layer is then formed on the lower SiN layer using process parameters that produce a relatively high residual stress, and also cause the upper SiN material to have relatively high hydrogen content. The lower SiN layer functions as a barrier that prevents/minimizes hydrogen migration to the silicide structures, which prevents defects leading to NiSi failures. The upper SiN layer functions to generate desirable high tensile stress in the underlying NMOS channel region to enhance the mobility of channel electrons. In some embodiments other dielectric materials are used.

15 Claims, 6 Drawing Sheets

(51) Int. Cl.
  *H01L 21/28* (2006.01)
  *H01L 21/02* (2006.01)
  *H01L 21/285* (2006.01)

(52) U.S. Cl.
  CPC .... *H01L 21/0234* (2013.01); *H01L 21/02211* (2013.01); *H01L 21/02274* (2013.01); *H01L 21/28097* (2013.01); *H01L 21/28518* (2013.01); *H01L 29/456* (2013.01); *H01L 29/7841* (2013.01); *H01L 29/7845* (2013.01)

(56) References Cited

U.S. PATENT DOCUMENTS

| | | | |
|---|---|---|---|
| 6,831,008 B2 | 12/2004 | Lu et al. | |
| 7,084,061 B2 | 8/2006 | Sun et al. | |
| 7,923,319 B2 | 4/2011 | Futase et al. | |
| 2008/0090369 A1* | 4/2008 | Akiyama | H01L 21/28518 438/308 |
| 2008/0191281 A1* | 8/2008 | Chidambarrao | H01L 21/84 257/351 |
| 2008/0272411 A1* | 11/2008 | Bo | H01L 21/268 257/288 |

OTHER PUBLICATIONS

Vengurlekar et al. "Influence of Hydrogen plasma surface treatment of Si sunstrate on Nickel Silicide formation" Journal of Vacuum Science & Technology. B, May 2006 (Freescale).

Steegen and Maex, "Silicide-induced stress in Si: origin ad consequences for MOS technologies," Materials Science and Engineering: R: Reports, vol. 38, No. 1, pp. 1-53, 2002.

Yu "Lifting Defect Improvement of Plasma Enhanced Nitride," 2014 ECS—The Electrochemical Society.

* cited by examiner

STRESSING STRUCTURE WITH LOW HYDROGEN CONTENT LAYER OVER NISI SALICIDE

FIELD OF THE INVENTION

This invention relates to semiconductor processing, and more particularly to improved methods for fabricating MOS devices using silicon-on-insulator (SOI) and deeply scaled down CMOS fabrication processes that utilize stressing structures to enhance the mobility of channel electrons.

BACKGROUND OF THE INVENTION

A silicide is a compound that combines silicon with (usually) more electropositive elements (e.g., nickel (Ni) or cobalt (Co)). The term "silicide" refers to a technology used in the microelectronics industry to facilitate low resistance (enhanced ohmic) electrical contacts between the active regions of a semiconductor device (e.g., a source or drain diffusion formed in a silicon substrate) and a supporting interconnect (e.g., aluminum or other metal) structure. The silicide formation process involves the reaction of a thin film containing metal with the surface of a silicon structure over the active regions of the device, ultimately forming a metal silicide contact through a series of annealing processes. The term "salicide" is a compaction of the phrase self-aligned silicide. The description "self-aligned" suggests that the contact formation does not require lithographic patterning processes, as opposed to a non-aligned technology such as polycide. Note that the terms "silicide" and "salicide" are effectively interchange as used herein because the metal silicide structures formed by the described formation processes may be accurately referred to as salicide.

Cobalt silicide (CoSi) and nickel monosilicide (herein "NiSi" or "NiSi silicide") are two silicide materials that are widely used in the microelectronics industry, with CoSi typically used in older fabrication technologies having larger minimum feature sizes (e.g., 0.13 µm and larger), and NiSi being the most commonly used silicide in VLSI technologies such as SOI or deeply scaled down CMOS (e.g., having minimum features sizes below 0.09 µm). NiSi silicide provides advantages over CoSi due to its smaller silicon consumption during the silicidation (silicide formation) process, due to its lower processing/formation temperature and thermal budget, due to its absence of the bridging failures, and due to its ability to produce small resistance increases in narrow silicided polysilicon lines. In addition, CoSi consumes substantially more silicon during its formation (i.e., 3.6 nm for 1 nm of metal vs. 1.8 nm for NiSi), which this makes the use of CoSi in transistors fabricated on SOI wafers with thin (0.18 micron and below) device layers difficult.

During early stages of the NiSi silicidation process, nickel reacts with silicon during the sputtered nickel thermal processing (i.e., when the interface between the nickel and silicon is heated to a temperature of approximately 300° C.) to form initial phases of nickel silicide. The resistivity of the initial nickel silicide phase decreases when Rapid Thermal Processing (RTP) is subsequently performed at temperatures between 400° C. and 550° C., which causes the initial metal-rich phases to convert into the desired nickel monosilicide (NiSi). The main disadvantage of NiSi formed in this manner is its relatively low thermal stability—that is, the low-resistivity NiSi transforms into high-resistivity $NiSi_2$ if heated above 600° C. The increased resistivity is associated with enhanced diffusion of Ni atoms, which are released during the conversion of NiSi to $NiSi_2$, into the underlying silicon structure, which creates generation-recombination centers that cause excessive leakage currents in the Si—NiSi interface junctions (see, e.g., M. Tsuchiaki et al., "Junction Leakage Generation by NiSi Thermal Instability Characterized Using Damage-Free n+/p Silicon Diodes", Jpn. J. Appl. Phys. 43 5166, 2004 (Toshiba)).

The release of free Ni atoms due to overheating is not the only player leading to enhanced diode leakages. A certain level of hydrogenation is needed to decrease the sheet resistance of the silicide films at the expected processing temperatures [see A. Vengurlekar et al., "Influence of hydrogen plasma surface treatment of Si substrate on Nickel Silicide formation" Journal of Vacuum Science & Technology. B, May 2006 (Freescale)]. However, excess hydrogen was shown to lead to defects at Si—NiSi interface junction. The above mentioned destruction of the NiSi phase and the Ni-enhanced penetration into silicon starts at temperatures of approximately 500° C. for specimens with hydrogen-related defects. Ni-enhanced diffusion causes not only the uniform leakage increase due to appearance of the recombination centers, but also stimulates Ni/NiSi spikes in the silicon. These spikes can reach the metallurgical junctions and result in catastrophic failures (junction breakdowns) of the silicided diodes.

Another possible mechanism that leads to the silicided diode failures is connected with dislocations and cracking in the silicon structure under the NiSi. The as-deposited NiSi induces small mechanical stresses in the Si-substrate [see A. Steegen and K. Maex, "Silicide-induced stress in Si: origin and consequences for MOS technologies," Materials Science and Engineering: R: Reports, vol. 38, no. 1, pp. 1-53, 2002], and significant additional mechanical stresses may be introduced by subsequent processing. When the local shear stress exceeds the critical yield stress of silicon (e.g., due to thermal expansion at elevated temperatures), dislocations may be generated in the Si-substrate underneath silicide lines.

The stress-related dislocation phenomena mentioned above become especially important when special stressing structures are utilized to enhance channel electron mobility in MOS transistors formed by SOI or CMOS technology. Conventional stressing structures (also referred to as "stressing layers", "stress liners" or "stressors") are single-layer dielectric structures disposed over associated transistors (e.g., NMOS or PMOS transistors formed using SOI or deeply scaled down CMOS technologies), where the stressing structures are specifically formed with a residual mechanical (tensile or compressive) stress that serves to significantly increase carrier mobility in the associated transistor's channel region by applying transmitting stress into the underlying silicon. Conventional stressing structures comprise silicon carbide, silicon nitride or silicon oxynitride, and are typically deposited using plasma-enhanced chemical vapor deposition (PECVD) or low-pressure CVD (LPCVD) processes. For example, U.S. Pat. No. 7,084,061 Mil Chun Sul "Methods of fabricating a semiconductor device having MOS transistor with strained channel" (2006, Samsung) describes forming NiSi structures on the gate electrode and the source and drain regions of an NMOS transistor, forming a stressing layer on the NiSi layer over the gate electrode and the source and drain regions and, after forming the stress layer, annealing the stressing layer to increase its residual tensile stress, whereby the residual tensile stress of the stressing layer is transmitted into the underlying silicon substrate, producing a localized tensile stress component in the channel region separating the active regions of the transistor.

A problem with the formation of stressing layers on NiSi silicide using conventional methods is that the stressing layer deposition process can result in various parasitic effects (e.g., poor adhesion and pealing) due to the presence of excessive oxygen and hydrogen at the interface between the stressing layer and the NiSi silicide. For example, when a natural oxide film is left at the interface between the NiSi and a silicon nitride (SiN) stressing layer, subsequent process steps (e.g., heating the semiconductor substrate after deposition of the SiN layer) may result in abnormal changes of the NiSi structure. Oxygen in the native oxide film on the NiSi surface (or on a capping TiN layer) was reported to be a cause of poor adhesion of the overlying SiN layer. The silicon nitride film, especially a rather thick stressing layer at the surface of NiSi, may peel off or blister from the silicide. Such blistering and peel-off can lead to NiSi and Si defects and thus to leakages in diodes under NiSi. The mechanism of such defects creation could be connected with exceeding the threshold for defect generation stresses and also with changes of NiSi structure during subsequent thermal processing.

Various approaches have been developed to improve the adhesion between SiN and NiSi. For example, U.S. Pat. No. 6,831,008 ("Nickel silicide-silicon nitride adhesion through surface passivation", Jiong-Ping Lu, Texas Instruments, 2004) associates the adhesion problems with a silicon-rich film formed in the beginning of the SiN deposition, and describes treating the NiSi surface covered with TiN capping layer with plasma-activated nitrogen species for better adhesion to silicon nitride. Treatment of NiSi surfaces in an inert gas has also been taught as improving adhesion between SiN and NiSi. For example, U.S. Pat. No. 7,923,319 ("Method for manufacturing a semiconductor integrated circuit device circuit device", T. Futase, Renesas, 2011) teaches a low bias plasma treatment in an inert gas atmosphere before SiN deposition, but in this case the SiN film does not include an intentionally formed residual stress (i.e., the SiN film serves as a contact etch stop layer (CESL), not as a stressor). Japanese Patent No. JP 200031092 teaches irradiating NiSi with hydrogen active species (H*) in order to remove the oxide without causing NiSi agglomeration at the subsequent thermal steps.

Hydrogen as a cause of the interface defects between SiN and silicon is mentioned in "Lifting Defect Improvement of Plasma Enhanced Nitride", Hyunkwan Yu, 2014 ECS—The Electrochemical Society. Hydrogen radicals were generated during a plasma nitride deposition process, and these hydrogen radicals could be captured between SiN and silicon, which caused lifting defects. It is worth mentioning here once again that alternative mechanisms are suggested, but it has been confirmed by research groups from several leading semiconductor companies that the excess hydrogen can generate hydrogen related surface effects and diode failures.

A method for fabricating a semiconductor device having low hydrogen contents is taught in U.S. Pat. No. 6,071,784 (Mehta et al., 2000), which teaches an etch stop silicon nitride layer deposited on a semiconductor substrate after silicidation, and then heated to approximately 750° C. to decrease the hydrogen content and stabilize MOS transistors by finding the necessary hydrogen balance. Unfortunately, this method is not suitable for NiSi because, as mentioned above, the high temperature heat treatment would cause the low resistance NiSi phase to transformation into a high resistance $NiSi_2$ phase.

Other methods were also attempted by various groups to optimize the performance of NiSi and overlying layers: moderation of post-Ni silicidation thermal budget, alloying Ni with Pt, addition of metals such as Zirconium to TiN capping layer, and others. Nevertheless, a problem of integrating NiSi with SiN cap layers, and in particular thick SiN stress liners, still exists in the microelectronics (semiconductor fabrication) industry.

What is needed is a method for addressing the various problems mentioned above related to the formation of stressing structures on NiSi structures. In particular, what is needed is an improved NMOS device that utilizes a stressing structure to enhance the mobility of channel electrons, and avoids the various problems mentioned above related to the formation of the stressing structure on the NMOS device's NiSi structures.

SUMMARY OF THE INVENTION

The present invention is directed to a method of forming a multi-layer stressing stack (structure) that applies desired high tensile stress in the channel region of an underlying MOS transistor (or other device) while avoiding defects leading to diode (transistor junction) failures at the one or more silicide surfaces. A lower (first) dielectric layer is formed by depositing a (first) dielectric material having a low hydrogen content and a relatively low residual stress that directly contacts the silicided surfaces and applies a relatively low tensile stress component in the channel region. An upper (second) dielectric layer is then formed on an upper surface of the lower dielectric layer by depositing a (second) dielectric material using process parameters that produce a relatively high residual stress that applies a relatively high tensile stress component in the channel region of the underlying MOS transistor. Note that the process parameters utilized to form the upper dielectric layer result in a higher hydrogen content than that of the lower dielectric layer. According to an aspect of the present invention, the lower dielectric layer functions as a barrier that prevents or minimizes the migration of excessive hydrogen from the upper dielectric layer to the silicide structures, while the upper dielectric layer functions to produce the desired high tensile stress in the underlying device channel region. That is, by disposing a low hydrogen content (e.g., 15 atomic percent) dielectric layer between the upper dielectric layer and the silicide structures, the migration of excessive hydrogen to the silicide is impeded, whereby blistering and local peeling during deposition of the stressing structure is avoided, and hydrogen-related defects in the silicide structures that occur when contacted by high hydrogen content material are minimized. Moreover, by forming the lower dielectric layer as a soft structure (i.e., having a low residual stress), the present invention prevents peeling and blistering at the silicide/stress layer interface during subsequent process steps that require higher thermal budgets (i.e., including deposition of the upper dielectric layer). After forming the lower dielectric layer in this manner, the upper dielectric layer may be formed using substantially conventional stressing layer fabrication techniques. Accordingly, the multi-layer stressing stack utilizes the high residual tensile stress component generated by the upper layer to produce the desired total tensile stress in the underlying device channel region, and utilizes the low hydrogen content of the lower dielectric layer to prevent the migration of excessive hydrogen to the silicide, thereby avoiding the problems encountered by conventional stressing layer fabrication methods.

In an exemplary embodiment, the novel method is implemented during an SOI fabrication process (i.e., on partially or fully depleted SOI) to fabricate an NMOS transistor in which the mobility of electrons in the NMOS transistor's channel region is enhanced by way of a bi-layer SiN stressing stack configured in the manner described above. In a practical embodiment, an SOI antenna switch (semiconductor device) is produced using multiple NMOS transistors fabricated by way of the novel methods described herein, whereby the SOI antenna switch exhibits improved Figure of Merit (FOM) values by way of reduced on-resistance (Ron) in comparison to comparable NMOS transistors having conventional SiN stressing layers.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved method for forming stressing layers on NiSi structures, and to semiconductor devices formed using these methods. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The present inventors observed that source/drain n-channel transistor diode leakages in SOI NiSi technology were enhanced when a single SiN stressing layer with a thickness of 1000 A to 2000 A was used. Although the exact mechanism of the diode leakage was unclear, the inventors observed improved performance of when certain hydrogen balances were maintained in experimental devices. The stressed stack solution presented below was conceived when the inventors utilized a stacked multi-layer stressing liner including a bottom (lower) SiN layer that was depleted of hydrogen. Although the present invention is described below with particular reference to a bi-layer SiN stressing stack configurations, the various alternative dielectric (stressing layer) materials mentioned below may also be utilized in any combination. Moreover, although the present invention is described with specific reference to the fabrication of exemplary NMOS transistors, it is understood that the configuration and purpose of the multi-layer stressing stack approach may be beneficially implemented in other devices as well, such as scaled-down transistors in advance planar or FinFet technologies (e.g. 45 nm and below).

Figure 1:
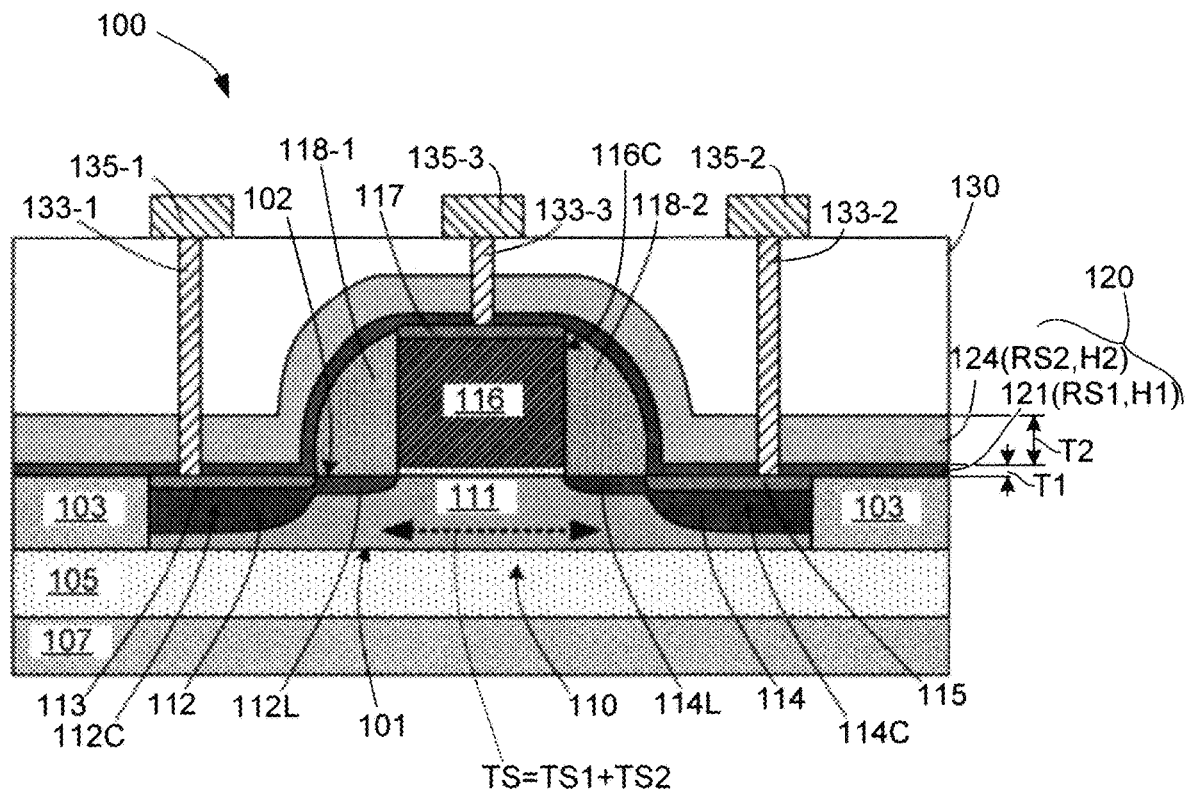
FIG. 1 is a partial simplified cross-sectional side view showing an NMOS transistor formed in accordance with an exemplary embodiment of the present invention.

FIG. 1 shows a partial semiconductor device (e.g., an SOI RF switch) 100 including an SOI NMOS transistor 110 formed on an SOI (semiconductor) substrate 101 according to a simplified exemplary embodiment of the present invention. In accordance with known practices, SOI substrate 101 is isolated by way of shallow-trench isolation (STI) structures 103 and a BOX oxide layer 105, which is disposed between substrate 101 and a base semiconductor substrate 107. NMOS transistor 110 includes base NMOS structures fabricated in accordance with known SOI fabrication techniques. That is, similar to conventional NMOS transistors, NMOS transistor 110 generally includes a p-doped channel region 111 that is formed in SOI substrate 101 between an n-doped source region 112 and an n-doped drain region 114, and includes a poly-Si gate structure 116 formed on a gate oxide layer over channel region 111. Sidewall spacer (oxide or oxide/nitride) structures 118-1 and 118-2 are formed on opposite sides of gate structure 116 per normal practices. In some embodiments, source region 112 and drain region 114 respectively include lightly doped portions 112L and 114L that extend under sidewall spacer structures 118-1 and 118-2, respectively. Electrical connections between SOI NMOS transistor 110 and other devices of semiconductor device 100 (e.g., by way of are omitted for clarity.

NMOS transistor 110 also includes nickel monosilicide (NiSi) structures that function to provide ohmic contacts of the source region 112, drain region 114, and poly-Si gate structure 116. Specifically, NiSi (silicide) structures 113 and 115 are respectively formed on contact regions 112C and 114C of source region 112 and drain region 114 such that upper surfaces of NiSi structures 113 and 115 are substantially coplanar with upper surface 102 of adjacent portions of semiconductor substrate 101. A third NiSi structure 117 is formed on an upper surface of poly-Si gate structure 116. NiSi structure 113 facilitate ohmic contact between an associated signal source (e.g., metal lines) 135-1 by way of a metal via structure 133-1 that extends through a pre-dielectric layer 130 between source 135-1 and NiSi structure 113. Similarly, ohmic contact is provided between associated signal sources 135-2 and 135-3 by way of associated metal via structure 133-2 and 133-3. Electrical connections between SOI NMOS transistor 110 and other devices of semiconductor device 100 (e.g., by way of signal sources 135-1 to 135-3) and other subsequently formed back-end fabrication are omitted for clarity.

Similar to some conventional NMOS transistors, NMOS transistor 110 is configured to exhibit enhanced mobility of channel electrons by way of including a stressing stack 120 that applies a tensile stress TS in channel region 111. According to an aspect of the present invention, stressing stack 120 includes a lower (first) dielectric layer 121 formed on upper surface 102 of semiconductor substrate 101, and an upper (second) dielectric layer 124 formed on an upper surface 122 of the lower dielectric layer 121 such that both layers 121 and 124 extend laterally from source region 112 to drain region 114 over gate structure 116, thus extending over channel region 111. Lower dielectric layer 121 is formed on upper surface 102 of substrate 101 and over gate structure 116 such that portions of lower dielectric layer 121 contact NiSi structures 113, 115 and 117. As explained in additional detail below, lower dielectric layer 121 is formed using selected methods and compositions such that lower dielectric layer 121 has a relatively low hydrogen content H1 (e.g., less than 20 atomic %, preferably in the range of 10 to 20 atomic %). In a preferred embodiment, lower dielectric layer 121 is formed as a substantially continuous barrier (i.e., such that silicide structures 113, 115 and 117 are entirely separated from upper dielectric layer 124 by corresponding intervening portions of lower dielectric layer 121), and is formed with a nominal thickness T1 that is both sufficient to prevent a significant amount of hydrogen from diffusing between upper dielectric layer 124 to silicide structures 113, 115 and 117 (e.g., greater than 50 Å), and is also thin enough to facilitate the operable transfer of residual stress from upper dielectric layer 124 to channel region 111 (e.g., in a range of 50 Å to 300 Å). Due its composition, thickness and/or fabrication process by which it is formed, lower dielectric layer 121 is characterized by having a relatively low (first) residual stress RS1 (i.e., in comparison to that of upper dielectric layer 124) that operably generates a corresponding relatively-low (first) tensile stress component TS1 in channel region 111. In contrast to lower dielectric layer 121, upper dielectric layer 124 is fabricated using methods and compositions that are consistent with those utilized to generate conventional stressing structures, whereby upper dielectric layer 124 typically comprises a relatively high hydrogen-content (second) dielectric material (i.e., greater than 20 atomic %, typically in the range of 20 to 30 atomic %), and is formed with a (second) residual stress RS2 that that applies a corresponding relatively high (second) tensile stress component TS2 in channel region 111. Note that the total tensile stress TS generated in channel region 111 is a product of (first) tensile stress component TS1 and (second) tensile stress component TS2, where residual stresses RS1 and RS2 of dielectric layers 121 and 124 are configured such that the magnitude of tensile stress component TS2 is greater than the magnitude of tensile stress component TS1. Accordingly, stressing stack 120 primarily utilizes upper dielectric layer 124 to generate total tensile stress TS in channel region 111 at a desired level in a manner similar to that utilized in conventional NMOS transistors, but stressing stack 120 avoids the various problems associated with conventional stressing layers described above by way of providing low hydrogen content lower dielectric layer 121 between the high hydrogen content dielectric material of upper dielectric layer 124 and NiSi structures 113, 115 and 117.

Figure 2:
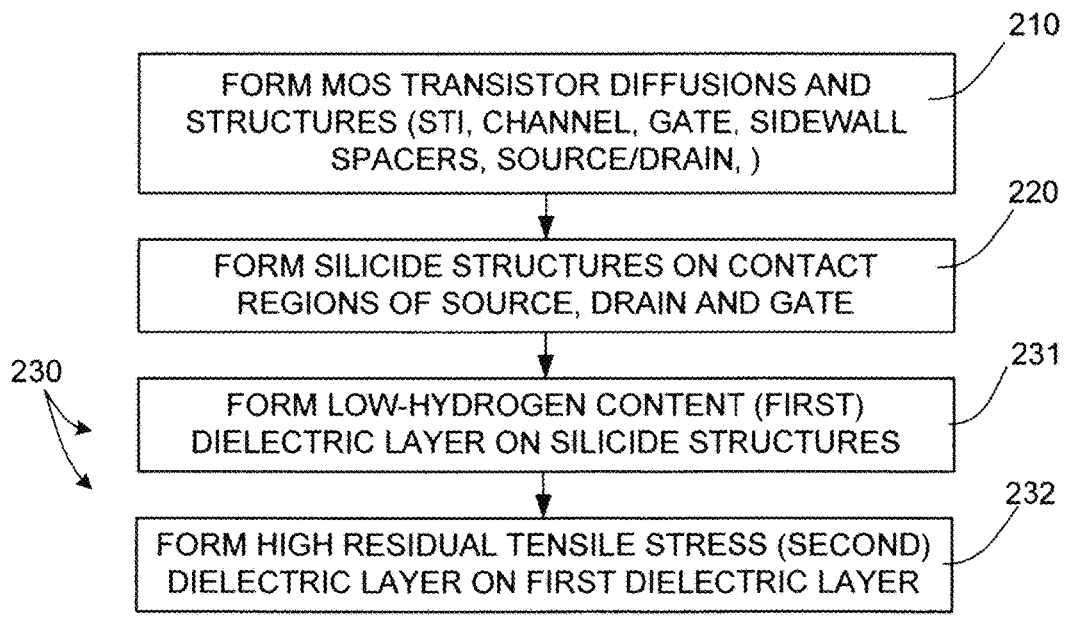
FIG. 2 is a flow diagram showing a method for producing the NMOS transistor of FIG. 1 according to a generalized embodiment of the present invention.

FIG. 2 depicts a method for fabricating MOS transistor 100 (FIG. 1) according to a generalized embodiment of the present invention. Referring to block 210, base MOS structures of the MOS transistor are fabricated on a suitable semiconductor substrate such that contact regions of the respective source/drain and gate structures are exposed on upper surfaces of the various semiconductor surfaces. For example, referring to FIG. 1, known SOI fabrication techniques are utilized to form a p-doped channel region 111 between n-doped source region 112 and n-doped drain region 114 in SOI substrate 101 below gate structure 116 such that a (first) contact region 112C of source region 112 and a (second) contact region 114C of drain region 114 are disposed adjacent to upper surface 102 of SOI substrate 101, and such that contact region 116C is disposed adjacent to the upper surface of polysilicon gate structure 116. Referring to block 220, a plurality of separate nickel monosilicide (NiSi) structures are then formed in the contact regions of the source/drain and gate structures such that the NiSi structures are exposed on the upper semiconductor surfaces. For example, a (first) NiSi structure 113 is formed on source region 112 (i.e., in contact region 112C) and a (second) NiSi structure 115 is formed on drain region 114 (i.e., in contact region 114C) such that NiSi structures 113 and 115 are exposed on upper surface 102 of semiconductor substrate 101. Similarly, a (third) NiSi structure 117 is formed in contact region 116C such that NiSi structure 117 is disposed on upper surface of polysilicon gate structure 116. Referring to the lower portion of FIG. 2, reference number 230 generally refers to the formation of stressing stack 120 across the base MOS structures (i.e., extending over gate structure 116 and across source region 112 and drain region 114) such that stressing stack 120 generates the desired tensile stress TS in channel region 111. According to an aspect of the present invention, the formation of stressing stack 120 includes (block 231) forming lower (first) dielectric layer 121 over upper surface 102 of semiconductor substrate 101 such that respective portions of lower dielectric layer 121 contact the various NiSi (silicide) structures 113, 115 and 117, and then (block 232) forming upper (second) dielectric layer 124 on an upper surface 122 of lower dielectric layer 121. According to another aspect of the present invention, lower dielectric layer 121 and upper (second) dielectric layer 124 are respectively fabricated such that a (first) hydrogen content H1 of lower dielectric layer 121 is at least ten percent lower than a (second) hydrogen content H2 of second dielectric layer 124, preferably in the range of 10% to 50% lower, and more preferably in the range of 20% to 30% lower). According to yet another aspect of the present invention, lower dielectric layer 121 and upper (second) dielectric layer 124 are respectively fabricated using various techniques such that residual stress RS1 of said first dielectric layer 121 is at least 20% lower than second high residual stress RS2 of second dielectric layer 124 (e.g., when measured for films having the same thickness, first tensile stress component TS1 is in the range of 20% to 50% lower than second tensile stress component TS2).

FIGS. 3(A) to 3(G) depict processes performed during the fabrication of an SOI NMOS transistor, where the processes are consistent with the method of FIG. 2.

Figure 3A:
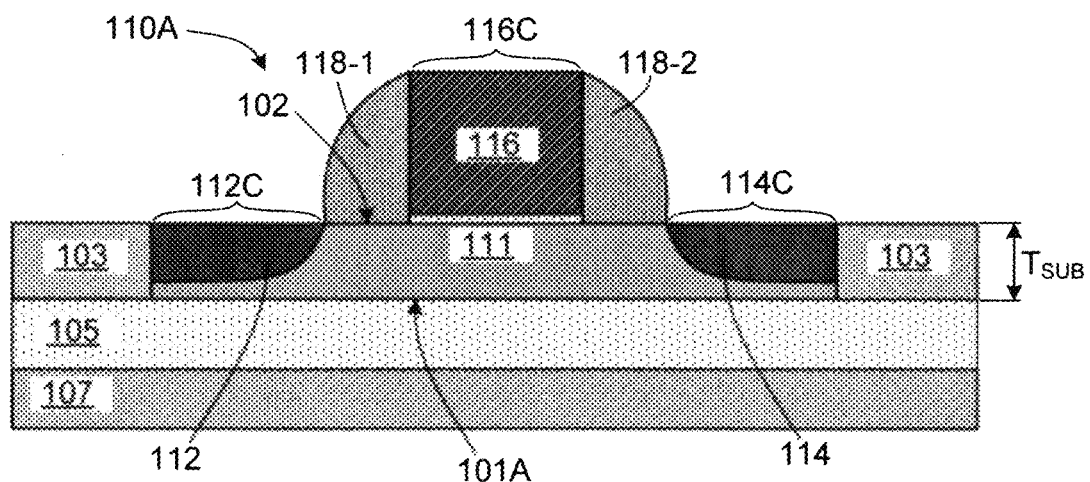
FIGS. 3(A), 3(B), 3(C), 3(D), 3(E), 3(F) and 3(G) are simplified cross-sectional side view showing processes associated with the production of an NMOS transistor according to another embodiment of the present invention.

FIG. 3(A) depicts a partially formed NMOS transistor 110A after its base MOS structures have been fabricated on an SOI substrate 101A. In an exemplary practical embodiment, SOI substrate 101A has a thickness $T_{SUB}$ in the range 200 Å to 2000 Å, and comprises monocrystalline silicon having p-type doping in the range of $1 \times 10^{14}$ to $1 \times 10^{17}$ atoms per cm$^{-3}$, and preferably approximately $1 \times 10^{15}$ atoms per cm$^{-3}$. SOI substrate 101A is fabricated using known SOI fabrication techniques such that it is isolated laterally from adjacent device elements (not shown) by way of shallow trench isolation structures 103, and is isolated vertically by way of buried oxide (BOX) layer 105, which is formed on a semiconductor (e.g., monocrystalline silicon) base substrate 107. Partial NMOS transistor 110A is fabricated on and over SOI substrate 101A using known SOI fabrication techniques. For example, after STI isolation and gate oxidation, polycrystalline silicon (herein "poly-Si" or "polysilicon") is deposited on upper substrate surface 102 and patterned to form gate structure 116, then spacer oxide (or an oxide/nitride stack) is deposited and etched back to form sidewall spacers 118-1 and 118-2 using well-known techniques. Subsequently n-type and p-type dopants are implanted through upper surface 102 into substrate 101A using known techniques to form source region 112 and drain region 114 of NMOS and PMOS devices, respectively, and then the upper surfaces exposed surfaces cleaned using a suitable solvent (e.g., diluted hydrofluoric acid), with an optional RCA wet clean also being performed in some embodiments. An optional in-situ radio frequency (RF) pre-clean is then performed to remove approximately 15A to 100A of surface material. In an alternative embodiment (not shown), substrate 101A is part of a monocrystalline silicon wafer, and NMOS transistor 110A is fabricated using known deeply scaled down CMOS fabrication techniques.

Figure 3B:
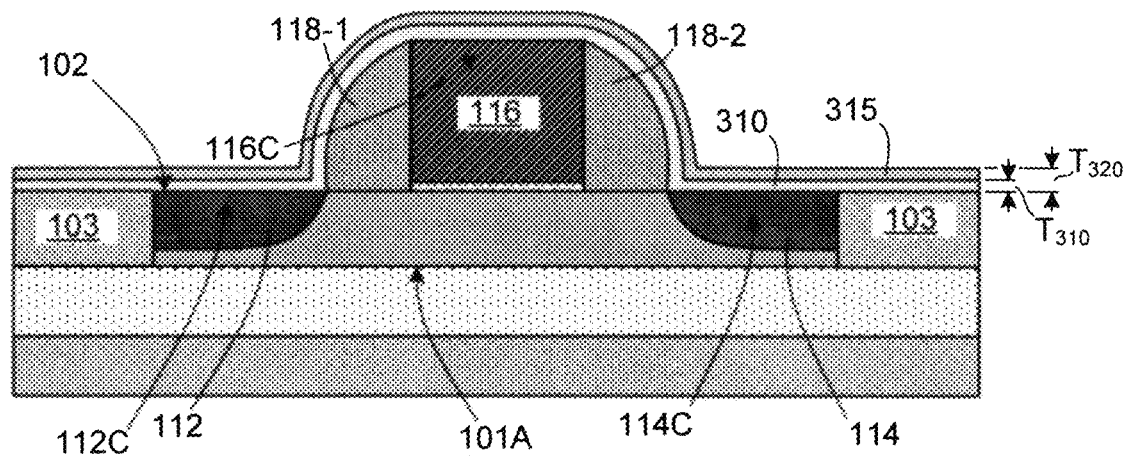
Figure 3C:
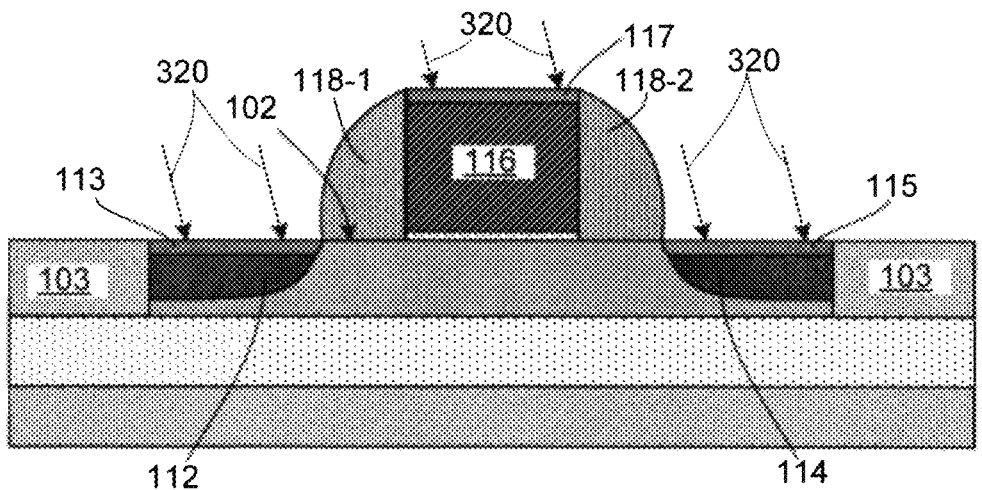

FIGS. 3(B) and 3(C) depict the subsequent formation of NiSi structures using two processing stages according to an exemplary embodiment, where the first stage involves nickel deposition and a TiN cap layer followed by a first NiSi rapid thermal processing (RTP) treatment, and the second stage involves removing residual Ni and TiN from oxide surfaces and performing a second NiSi RTP treatment.

FIG. 3(B) depicts an exemplary first stage during which a sputtering process is utilized to form a Nickel-bearing (first) layer 310 (e.g., Ni or nickel-platinum (NiPt)) on exposed surfaces including the upper surfaces of contact regions 112C and 114C over source regions 112 and drain region 114, and the upper surface of contact region 116C on gate structure 116C). In one embodiment, layer 310 is formed with a thickness $T_{310}$ in the range of 100 Angstroms (100 A) to 200 A (preferably 140 A). TiN cap layer 315 is then formed on an upper surface of layer 310 using known techniques with a thickness $T_{315}$ in the range of 50 A to 150 A (preferably 100 A). After forming TiN cap layer 315, a first NiSi RTP process is performed at a temperature in the range of 280° C. to 350° C., preferably at 320° C.

FIG. 3(C) depicts residual NiSi (silicide) structures 113, 115 and 117, which are formed over source region 112, drain region 114 and gate structure 116, respectively during the first stage, and also depicts an exemplary second stage of the silicide formation process involving the use of a suitable stripping and/or cleaning solution 320 to remove the TiN layer and the residual Ni layer from upper surfaces of STI regions 103 and sidewall spacers 118-1 and 118-2. In one embodiment, solution 320 is implemented using a suitable SPM (i.e., sulfuric acid and hydrogen peroxide) mixture and typical Standard Clean 1 (SC1) cleaning chemical, and is performed such that upper surfaces of these dielectric regions are exposed at the end of the stripping and cleaning process. After the stripping and cleaning process, a second NiSi RTP process is performed at a temperature in the range of 400 to 575° C., preferably at 450° C.

Figure 3D:
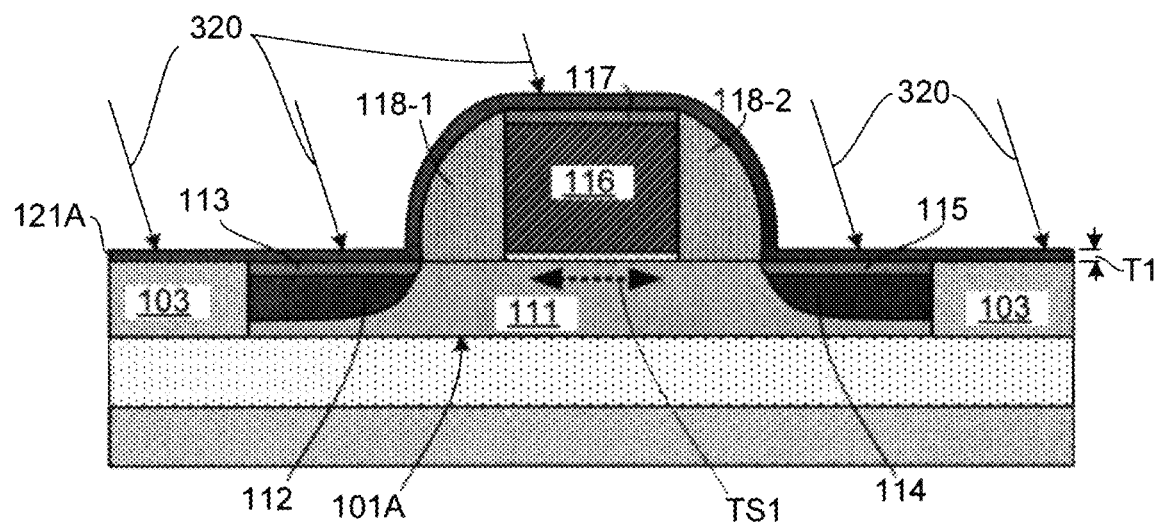

FIG. 3(D) depicts the subsequent deposition of (first) dielectric material 320 during the formation of lower (first) dielectric layer 121 over upper surface 102 of SOI substrate 101A. Dielectric material 320 is deposited over gate structure 116 between source region 112 and drain region 114 using known techniques such that respective portions of lower dielectric layer 121 contact NiSi structures 113, 115 and 117, and is formed in a manner that generates a first residual stress RS1, which applies tensile stress component TS1 in channel region 111. In some embodiments, the formation of lower dielectric layer 121 involves depositing dielectric material 320 using a chemical vapor deposition (CVD), where dielectric material 320 comprises one of silicon nitride (SiN) and silicon oxynitride having a hydrogen content of 15atomic % or less, and the CVD process is performed until lower dielectric layer 121 has a thickness in the range of 50 A to 300 A. In a practical embodiment, SiN is deposited using a plasma enhanced chemical vapor deposition (PE CVD) process (e.g., with substrate 101A disposed in a gas atmosphere having a silane/ammonia/$N_2$ ratio 1:2:250 and maintained at a pressure in the range of 5 to 15 Torr and at a temperature in the range of 400° C. to 550° C., and generating plasma using high frequency RF power in the range of 50 to 100 Watts). Additional details associated with the formation and composition of SiN dielectric material suitable for forming lower dielectric layer 121 are provided below with reference to Table 1.

Figure 3E:
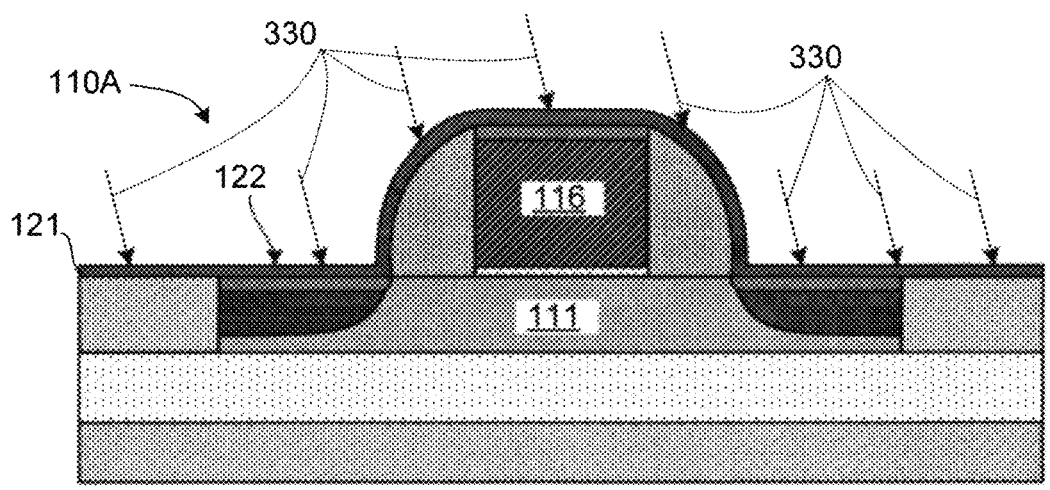

FIG. 3(E) depicts an optional nitrogen anneal process during which lower dielectric layer 121 is plasma treated in a nitrogen atmosphere. In an exemplary embodiment, the nitrogen anneal process involves disposing MOS transistor 110A in a reaction chamber containing $N_2$ gas maintained at a pressure in the range of 5 to 15 Torr, and at a temperature maintained in the range of 400 to 550° C., and operably applying RF power in the range of 50 to 100 Watts to generate a suitable plasma 330 at upper surface 122 of lower dielectric layer 121. Note that the hydrogen content in lower dielectric layer 121 is determined both by the deposition recipe (i.e., the hydrogen content of the deposited dielectric material that forms lower dielectric layer 121) and the subsequent nitrogen anneal process that is depicted in FIG. 3(E). That is, when the hydrogen content of the deposited dielectric material is sufficiently low, the optional nitrogen anneal process may be omitted. Conversely, when the hydrogen content of the deposited dielectric material is too high, the optional nitrogen anneal process may be beneficially utilized to decrease the hydrogen content in lower dielectric layer 121 by as much as 50%.

Figure 3F:
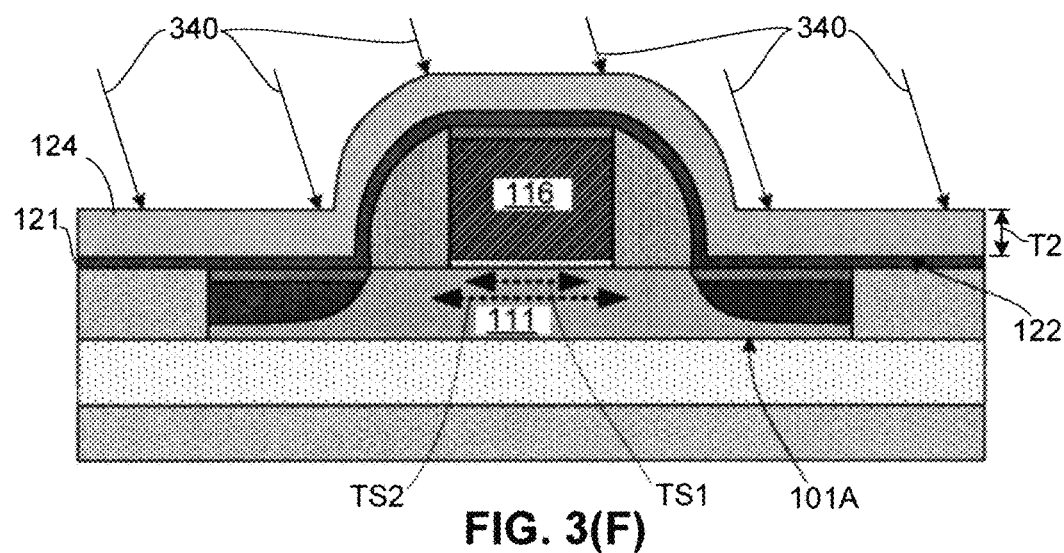

FIG. 3(F) depicts the subsequent deposition of (second) dielectric material 340 during the formation of upper (second) dielectric layer 121 over upper surface 102 of SOI substrate 101A. Dielectric material 340 is deposited on upper surface 122 of lower dielectric layer 121 such that it extends over gate structure 116 between source region 112 and drain region 114. Upper dielectric layer 124 differs from lower dielectric layer 121 in that dielectric material 340 is composed and deposited using known stressing layer fabrication techniques such that upper dielectric layer 124 generates a (second) residual stress RS2 that applies (second) tensile stress component TS2 on channel region 111. In practical embodiments, tensile stress component TS2, which is generated by upper dielectric layer 124, is significantly greater than tensile stress component TS1 generated by lower dielectric layer 121. In some embodiments, the formation of upper dielectric layer 124 involves depositing dielectric material 340 using a chemical vapor deposition (CVD), where dielectric material 340 comprises one of silicon nitride (SiN), silicon oxynitride, silicon carbide (SiC) and silicon carbon nitride (SiCN) using one of a chemical vapor deposition (CVD) process and a plasma enhanced chemical vapor deposition (PE CVD) process such that upper dielectric layer 124 has a thickness in the range of 500 A to 2000 A. In a practical embodiment, SiN is deposited using a PE CVD process (e.g., with substrate 101A disposed in a gas atmosphere having a silane/ammonia/$N_2$ ratio 1:2:750 and maintained at a pressure in the range of 5 to 15 Torr and at a temperature in the range of 400° C. to 550° C., and generating plasma using high frequency RF power in the range of 50 to 100 Watts). Note that the higher hydrogen content H2 of upper dielectric layer 124 is produced by depositing the upper dielectric layer material at a higher deposition rate, which is achieved by utilizing a higher total flow of the gaseous reactants, higher RF power and/or higher deposition pressure, whereby upper dielectric layer 124 corresponds to less stoichiometric SiN film (i.e., higher hydrogen content). Additional details associated with the formation and composition of SiN dielectric material suitable for forming upper dielectric layer 124 are provided below with reference to Table 1.

Figure 3G:
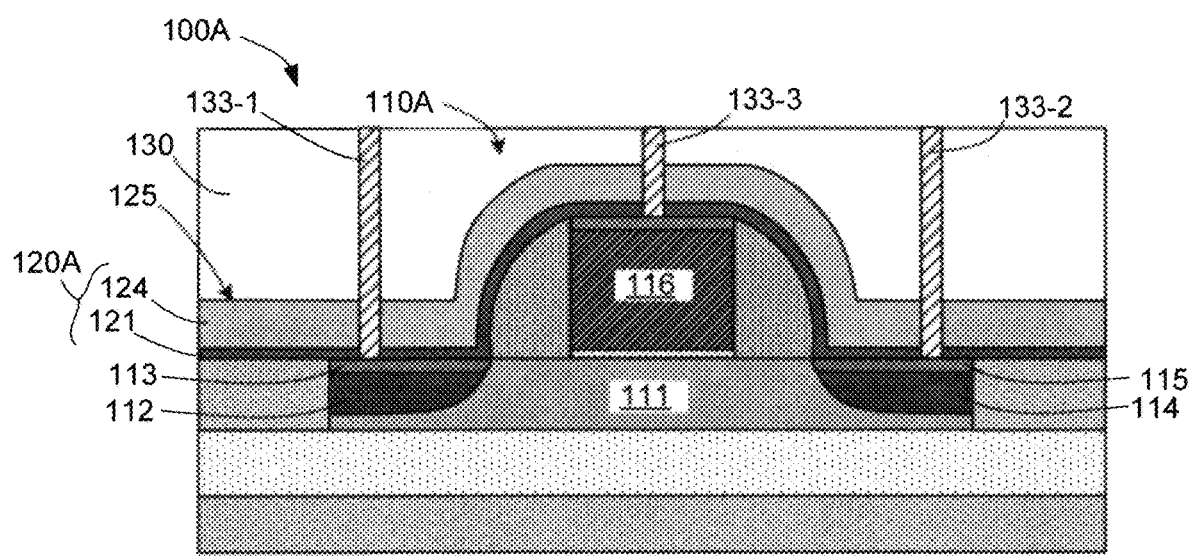

FIG. 3(G) depicts MOS transistor 110A after the deposition of pre-metal dielectric layer 130 on upper surface 125 of dielectric layer 124, and after the subsequent patterning of dielectric layer 130 and formation of metal contact vias 133-1 to 133-3, which provide electrical connection to source region 112, drain region 114 and gate structure 116 by way of NiSi structures 113, 115 and 117, respectively. Note that patterning and formation process involves etching through stressing structure 120A, which comprises lower layer 121 and upper layer 124. Subsequent back-end processing (e.g., forming Metal-1 signal lines 135-1 to 135-3, shown in FIG. 1) is then performed according to known techniques in order to complete the fabrication of device 100A.

The benefits of fabricating semiconductor devices (e.g., SOI RF switches) that utilize MOS transistors including the multi-layer stressing stacks produced in accordance with the present invention are illustrated below by way of comparing operating characteristics of three comparably sized NMOS transistors, where the first NMOS transistor is fabricated with a conventional high-stress-type SiN stressing layers (stressor), the second NMOS transistor fabricated with a low-stress SiN stressor, and the third NMOS transistor fabricated with a bi-layer stressing stack of the type described above with reference to FIG. 1.

Table 1 provides deposition conditions of the two different single layer (High Stress and Low Stress) SiN stressors and those used to generate a bi-layer stressing stack of the present invention on underlying NiSi structures. In Table 1, the "Film 1" heading indicates thickness and PE CVD process parameters (PP) associated with the fabrication of both single layer stressors and those associated with the lower SiN layer of the bi-layer stressing stack, the "In situ plasma treatment" heading indicates parameters utilizing during a plasma treatment process similar to that described above with reference to FIG. 3(E), and the "Film 2" heading indicates thickness and PE CVD process parameters associated with the fabrication of the upper SiN layer of the bi-layer stressing stack. Note that neither of the single layer stressors are subjected to processing after the Film 1 formation, which is indicated by the Not Applicable (NA) entries under the "In situ plasma treatment" and "Film 2" headings. Note also that the total thickness of the bi-layer stressing stack (i.e., 1200 Angstroms) is equal to the thickness of each of the single layer stressors. Actual thicknesses of the SiN Film 1 and SiN Film 2 layers from the ellipsometric measurements are provided in Table 1 (below).

TABLE 1

| Stress or Type | Film 1 | | In situ plasma treatment | Film 2 | |
|---|---|---|---|---|---|
| | Thickness | PE CVD PP | | Thickness | PE CVD PP |
| High Stress (only) | 1200 A | $SiH_4$:$NH_3$:$N_2$ ratio: 1:1.6:400; the total gas flow is 10 slm. Pressure: 5-15 Torr; HF RF Power: 50-100 W; Temp: 400-550° C. | NA | NA | NA |
| Low Stress (only) | 1200 A | $SiH_4$:$NH_3$:$N_2$ ratio: 1:2:250; the total gas flow is 10 slm. Pressure: 5-15 Torr; HF RF Power 50-100 W; Temp: 400- 550° C. | NA | NA | NA |
| Bi-layer stack | 200 A | $SiH_4$:$NH_3$:$N_2$ ratio: 1:2:250; the total gas flow is 10 slm. Pressure: 5-15 Torr; HF RF Power: 50-100 W; Temp: 400-550° C. | $N_2$ gas flow 5-10 slm; HF RF Power: 50-100 W; Press: 5-15 T; Temp: 400-550° C. | 1000 A | $SiH_4$:$NH_3$:$N_2$ ratio: 1:2:750; the total gas flow is 15 slm. Pressure 5-15 Torr, HF RF Power 50-100 W; Temp: 400-550° C. |

Table 2 shows the measurements of specimens produced in accordance with the compositions and processes of Table 1. Physical properties of the different SiN stressors and the related electrical leakage of the relevant devices. Hydrogen content was estimated from two independent measurements (i.e., Fourier transform infrared (FTIR) and Secondary-ion mass spectrometry (SIMS)). Stress measurements were performed using a Flexus FLX-5410 Thin Film Stress Measurement System produced by Toho Technology Corporation of Nagoya, Japan. The stress values provided in Table 2 (below) are given for the same thickness for all films.

TABLE 2

| Stressor Type | Refractive index | Mechanical Stress, GPa | H content, $cm^{-3}$ | Mean Ioff for the ET structure, Amperes |
|---|---|---|---|---|
| High Stress | 1.92 | 1.35 | 9.6E21 | 3.3E-7 |
| Low stress | 1.98 | 1.1 | 7.0E21 | 1.2E-7 |
| Bi-layer | 1.93 | 1.3 | 8.8E21 | 1.2E-7 |

Figure 4:
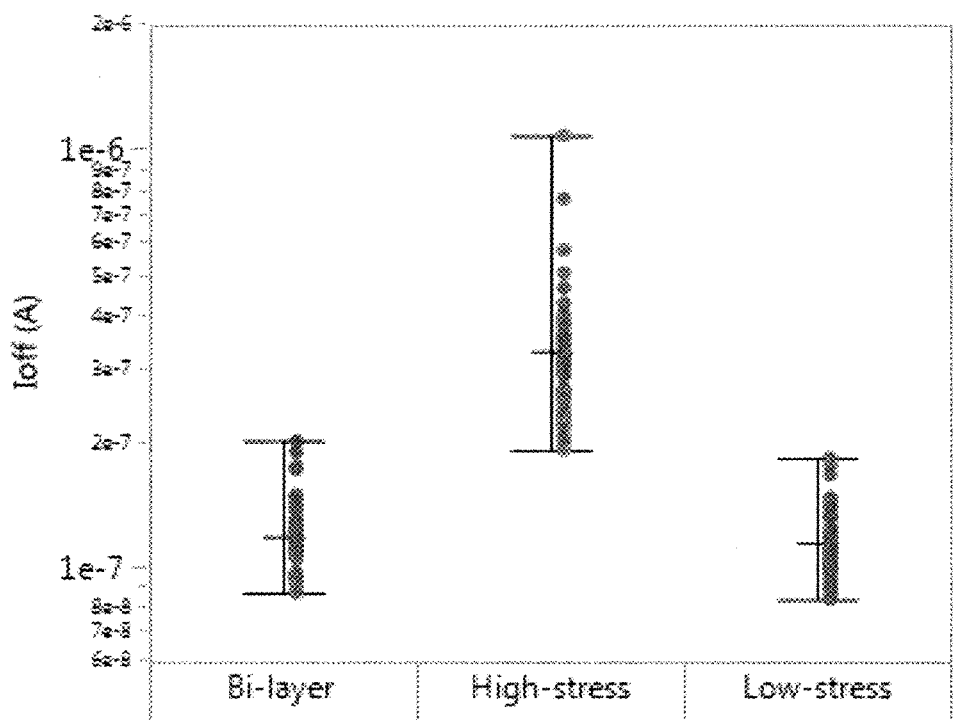
FIG. 4 is a diagram depicting experimental measurements generated by large-area multi-finger RF SOI NFETs including conventional stressing structures and bi-layer stressing structures of the present invention.
Figure 5:
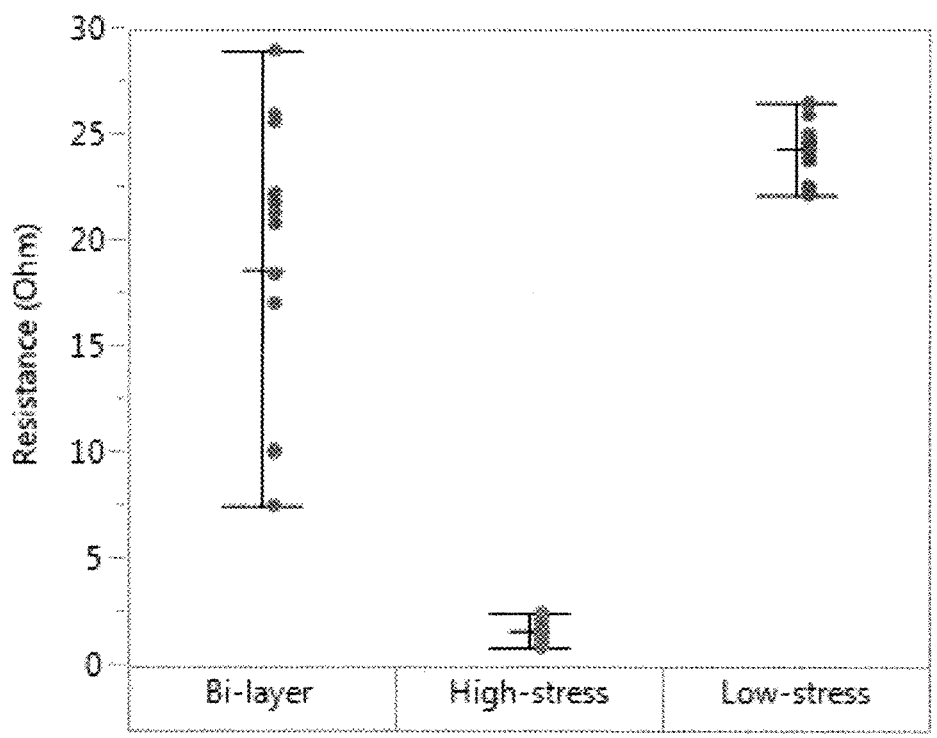
FIG. 5 is a diagram depicting experimental resistance measurements generated by NiSi serpentine structures in RF SOI wafers using conventional stressing structures and bi-layer stressing structures of the present invention.
Figure 6:
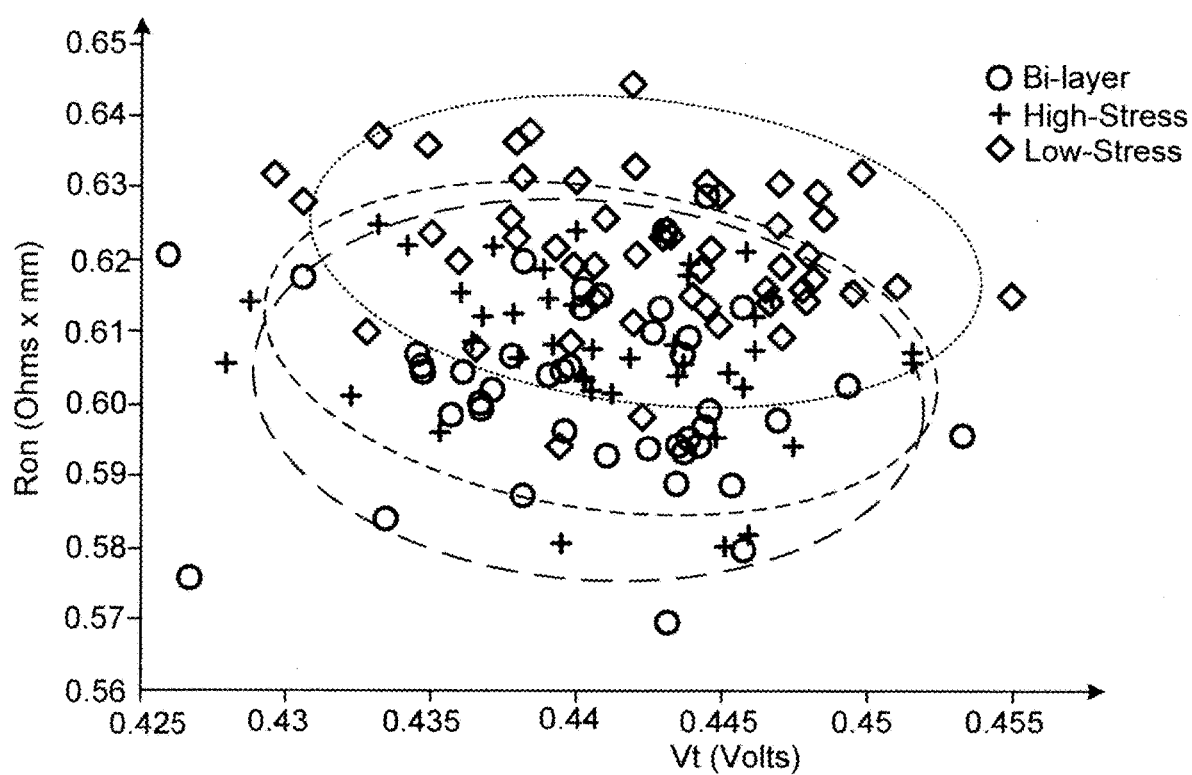
FIG. 6 is a diagram depicting measured on-resistance (Ron) versus gate threshold voltage of RF SOI transistors fabricated with conventional stressing structures and bi-layer stressing structures of the present invention.

FIGS. 4, 5 and 6 provide experimental data demonstrating reduced leakage of the silicided diodes without reducing the transistor performance in case of the novel bi-layer stressing SiN film. These figures compare performance of NMOS transistors produced with single-layer high-stress (HS) SiN stressors, single-layer low-stress (LS) SiN stressors, and bi-layer SiN stressing stacks formed in accordance with the details set forth above, and provide experimental proof that using bi-layer SiN stressing stack including a low-hydrogen content, low tensile stress lower SiN layer and a high-hydrogen-content, high tensile stress upper SiN layer solves the various problems that occur using conventional approaches while maintaining desirable operation characteristics.

FIG. 4 depicts Ioff (Amperes) measurements of comparable large-area multi-finger RF SOI NFETs (NMOS transistors), and indicates that leakage characteristics of NFETs produced with the bi-layer SiN stressing stack are comparable to the relatively low leakage characteristics of NFETs produced with low-stress SiN stressing layers, and significantly better than the relatively high leakage characteristics of NFETs produced with conventional high-stress SiN stressing layers.

FIG. 5 shows resistance of NiSi serpentine structures in RF SOI wafers with the three different stressor approaches described above. The expected resistance should be proportional to the serpentine length. Note that in the case of the High-stress SiN layers, lower resistance was measured, indicating that current flows through the silicon substrate due to the diode leakage. In contrast, the resistance measurements through serpentine NiSi structures with the novel bi-layer SiN stressing stack are comparable to the relatively high resistance characteristics of serpentine NiSi structures produced with a low-stress SiN layer.

FIG. 6 is a diagram showing Ron (Ohm*mm) versus threshold voltage Vt (Volts) measurement values of RF SOI transistors produced using the various SiN stressors mentioned above, with the dot-dashed-line oval indicating average measurements for RF SOI transistors formed with single-layer LS SiN stressors, the medium-dashed-line oval indicating average measurements for RF SOI transistors formed with single-layer HS SiN stressors, and the long-dashed-line oval indicating average measurements for RF SOI transistors formed with bi-layer SiN stressing stacks. Note that the measurements show no Ron loss in the case of RF SOI transistors produced using bi-layer SiN stressing stacks for a given Vt in comparison to the Ron measurements associated with RF SOI transistors produced using conventional high-stress SiN stressors.

Figure 7:
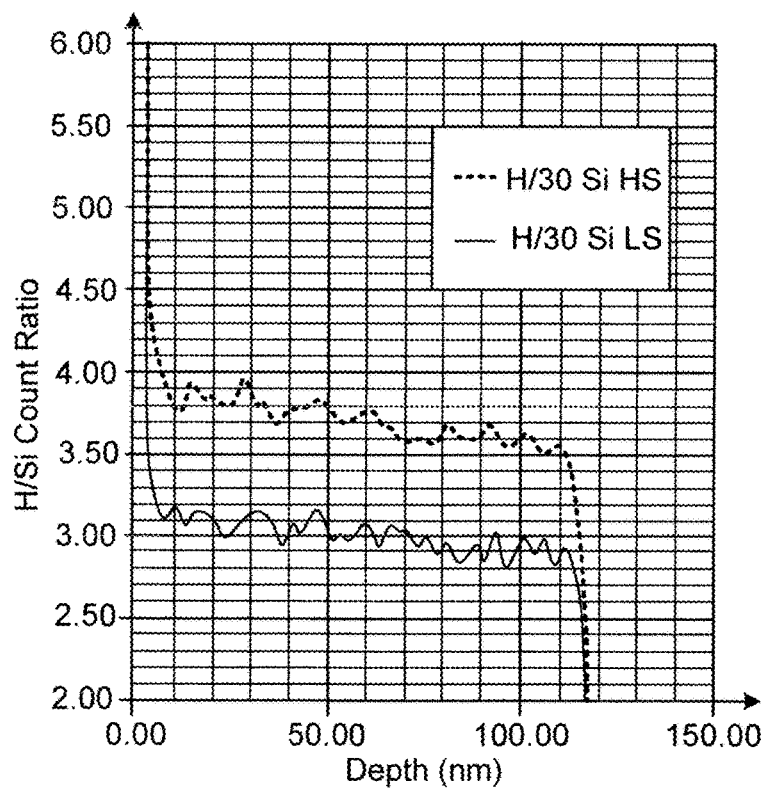
FIG. 7 is a graph depicting Time-Of-Flight (TOF) SIMS measurements of Low-Stress SiN layers and High-Stress SiN layers.

FIG. 7 is a graph showing normalized hydrogen content (Time-Of-Flight (TOF) SIMS) measurements of a Low-Stress (LS) SiN stressing layer and a High-Stress (HS) SiN stressing layer formed in accordance with the methods set forth in Table 1 and Table 2 (above). The designation "H/30" indicates that the data is normalized to the SIMS detector signal of silicon isotope $^{30}Si$ for this comparison. The measurement data indicates that LS SiN layers have an average hydrogen content that is at least 20% lower than that of HS SiN layers. The measurement results of Table 2 and FIGS. 4 and 5 demonstrate that utilizing thin lower LS SiN layer 121 as the bottom SiN film of stressing stack 120, the density of the defects (or level of leakages) is significantly lower than for single layer SiN stressors. These measurements clearly show that there is a correlation between the amount of hydrogen (as indicated in FIG. 7) and the amount of retained stress in lower LS SiN (dielectric) layer 121 and upper HS SiN layer 124. A plausible explanation of this observation and associated improved performance, consistent with the mentioned in the prior art effects related to the influence of hydrogen, may be explained as follows. First, the total stress TS of stressing stack 120 is mainly determined by the retained stress RS2 of upper HS SiN layer 124—that is, the presence of thin lower LS SiN layer 121 does not significantly change the total stresses imposed by stressing stack 120 consisting of thin lower LS SiN layer 121 and thick upper HS SiN layer 124. Second, lower LS SiN layer 121 has a relatively low hydrogen content (see FIG. 7) which may be further reduced by way of the optional plasma anneal in $N_2$ process described above with reference to FIG. 3(E), and therefore may be formed such that it does not cause the hydrogen-related defects in the underlying NiSi that occur when conventional single-layer high-stress stressor fabrication approaches are utilized. Third, the lower hydrogen content in lower LS SiN layer 121 excludes blistering and local peeling during its deposition stage, and the soft structure (i.e., low retained stress) of lower layer 121 excludes peeling and blistering during subsequent process steps that require a higher thermal budget, including deposition of upper HS SiN layer 124.

Although the present invention has been described with respect to certain specific embodiments, it will be clear to those skilled in the art that the inventive features of the present invention are applicable to other embodiments as well, all of which are intended to fall within the scope of the present invention. For example, the multi-layer stressing stack method of the present invention may be utilized in the fabrication of other MOS transistor types requiring enhanced mobility of electrons, or silicon photonics devices, where the refractive index of silicon is modulated by mechanical stresses.

The invention claimed is:

1. A method of fabricating a metal-oxide-silicon (MOS) transistor exhibiting enhanced mobility of channel electrons, the method comprising:
    forming a channel region between a source region and a drain region in a semiconductor substrate such that first and second contact regions of said source region and said drain region are respectively disposed adjacent to an upper surface of the semiconductor substrate;
    forming first and second nickel monosilicide (Nisi) structures on said source region and said drain region, respectively, such that said first and second Nisi structures are exposed on said upper surface of the semiconductor substrate;
    forming a stressing stack across the source region and the drain region such that said stressing stack generates a tensile stress in said channel region, wherein forming said stressing stack comprises:
    forming a first dielectric layer by depositing a first dielectric material having a first hydrogen content over the upper surface of the semiconductor substrate such that respective portions of said first dielectric layer contact said first and second Nisi structures, and such that said first dielectric layer includes a first residual stress that applies a first tensile stress component on said channel region;

forming a second dielectric layer on an upper surface of the first dielectric layer by depositing a second dielectric material using processes parameters that exclude an ultraviolet anneal and produce said second dielectric layer with a second thickness in the range of 500 Angstroms to 2000 Angstroms, with a second hydrogen content and with a second residual stress that applies a second tensile stress component on said channel region, wherein said second dielectric layer is entirely separated from said first and second Nisi structures by said first dielectric layer, wherein said first residual stress of said first dielectric layer is lower than said second residual stress of said second dielectric layer such that said first tensile stress component is at least 20 percent lower than said second tensile stress component, and wherein said first hydrogen content of said first dielectric layer is at least 10 percent lower than said second hydrogen content of said second dielectric layer.

2. The method of claim 1, wherein the semiconductor substrate comprises a Silicon-on-insulator substrate having a thickness in the range 200 Angstroms to 2000 Angstroms.

3. The method of claim 1,
wherein forming the first and second Nisi structures comprises:
depositing a first layer comprising nickel on the upper surface of the semiconductor substrate over the source region and the drain region such that the first layer has a thickness in the range of 100 Angstroms to 200 Angstroms;
depositing a TiN layer on the first layer such that the TiN layer has a thickness in the range of 50 Angstroms to 150 Angstroms;
performing a first thermal process at a temperature in the range of 280° C. to 350° C.;
removing residual portions of the first layer and the TiN layer; and
performing a second thermal process at a temperature in the range of 400° C. to 575° C.

4. The method of claim 1, wherein forming the first dielectric layer comprises depositing one of silicon nitride and silicon oxynitride using one of a first chemical vapor deposition (CVD) process and a first plasma enhanced chemical vapor deposition (PE CVD) process.

5. The method of claim 4, wherein forming the first dielectric layer comprises depositing silicon nitride using a plasma enhanced chemical vapor deposition (PE CVD) process such that said first dielectric layer has a first thickness in the range of 50 Angstroms to 300 Angstroms.

6. The method of claim 4, further comprising performing a plasma treatment of said first dielectric layer in a nitrogen atmosphere before forming said second dielectric layer.

7. The method of claim 6, where performing the plasma treatment comprises maintaining said nitrogen atmosphere in the range 5 Ton to 15 Torr and at a temperature in the range of 4000° C. to 550° C., and operably applying radio-frequency power in the range of 50 Watts to 100 Watts to generate a suitable plasma at the upper surface of said first dielectric layer.

8. The method of claim 7, wherein forming the second dielectric layer comprises depositing one of silicon nitride and silicon oxynitride using one of a second chemical vapor deposition (CVD) process and a second plasma enhanced chemical vapor deposition (PE CVD) process.

9. The method of claim 8, wherein forming the second dielectric layer comprises depositing silicon nitride using said second PE CVD process such that said second thickness of said second dielectric layer is in the range of 1000 Angstroms to 2000 Angstroms.

10. The method of claim 8,
wherein forming the first dielectric layer comprises depositing silicon nitride at a first deposition rate, and
wherein forming the second dielectric layer depositing silicon nitride at a second deposition rate that is higher than said first deposition rate.

11. The method of claim 1, wherein forming the second dielectric layer comprises depositing one of silicon nitride, silicon oxynitride, silicon carbide and silicon carbon nitride (SiCN) using one of a chemical vapor deposition (CVD) process and a plasma enhanced chemical vapor deposition (PE CVD) process.

12. The method of claim 1, wherein a total thickness of said stressing stack formed by said first and second dielectric layers is at least 1200 Angstroms.

13. The method of claim 1, further comprising forming a pre-metal dielectric layer directly on an upper surface of said second dielectric layer.

14. A method of fabricating a metal-oxide-silicon (MOS) transistor exhibiting enhanced mobility of channel electrons, the method including:
forming a channel region between a source region and a drain region in a semiconductor substrate such that first and second contact regions of said source region and said drain region are respectively disposed adjacent to an upper surface of the semiconductor substrate;
forming first and second nickel monosilicide (Nisi) structures on said source region and said drain region, respectively, such that said first and second Nisi structures are exposed on said upper surface of the semiconductor substrate; and
forming a stressing stack across the source region and the drain region such that said stressing stack generates a tensile stress in said channel region, wherein forming said stressing stack consists essentially of:
forming a first dielectric layer by depositing a first dielectric material having a first hydrogen content over the upper surface of the semiconductor substrate such that respective portions of said first dielectric layer contact said first and second Nisi structures, and such that said first dielectric layer includes a first residual stress that applies a first tensile stress component on said channel region; and
forming a second dielectric layer on an upper surface of the first dielectric layer by depositing a second dielectric material using processes parameters that produce said second dielectric layer with a second residual stress that applies a second tensile stress component on said channel region and with a second hydrogen content, and such that said second dielectric layer is entirely separated from said first and second Nisi structures by said first dielectric layer,
wherein said first hydrogen content of said first dielectric layer is at least 10 percent lower than said second hydrogen content of said second dielectric layer, and
wherein said first residual stress of said first dielectric layer is lower than said second residual stress of said second dielectric layer such that said first tensile stress component is at least 20 percent lower than said second tensile stress component.

15. A method of fabricating a metal-oxide-silicon (MOS) transistor exhibiting enhanced mobility of channel electrons, the method including:
- forming a channel region between a source region and a drain region in a semiconductor substrate such that first and second contact regions of said source region and said drain region are respectively disposed adjacent to an upper surface of the semiconductor substrate;
- forming first and second nickel monosilicide (Nisi) structures on said source region and said drain region, respectively, such that said first and second Nisi structures are exposed on said upper surface of the semiconductor substrate; and
- forming a stressing stack across the source region and the drain region such that said stressing stack generates a tensile stress in said channel region, wherein forming said stressing stack consists essentially of:
  - forming a first dielectric layer by depositing a first dielectric material having a first hydrogen content over the upper surface of the semiconductor substrate such that respective portions of said first dielectric layer contact said first and second Nisi structures, and such that said first dielectric layer includes a first residual stress that applies a first tensile stress component on said channel region;
  - performing a plasma treatment of said first dielectric layer in a nitrogen atmosphere before forming said second dielectric layer; and
  - forming a second dielectric layer on the upper surface of the first dielectric layer by depositing a second dielectric material using processes parameters that produce said second dielectric layer with a second residual stress that applies a second tensile stress component on said channel region and with a second hydrogen content,
- wherein said first hydrogen content of said first dielectric layer is at least 10 percent lower than said second hydrogen content of said second dielectric layer, and
- wherein said first residual stress of said first dielectric layer is lower than said second residual stress of said second dielectric layer such that said first tensile stress component is at least 20 percent lower than said second tensile stress component.

* * * * *